US012630930B2

(12) United States Patent
Moon et al.

(10) Patent No.: US 12,630,930 B2
(45) Date of Patent: May 19, 2026

(54) METHODS OF FABRICATING SAMPLE WAFERS

(71) Applicant: SAMSUNG ELECTRONICS CO., LTD., Suwon-si (KR)

(72) Inventors: Hyungsuk Moon, Suwon-si (KR); Seungkoo Shin, Pohang-si (KR); Minjung Kim, Suwon-si (KR); Sanghwang Park, Pohang-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 329 days.

(21) Appl. No.: 18/301,347

(22) Filed: Apr. 17, 2023

(65) Prior Publication Data

US 2023/0349050 A1     Nov. 2, 2023

(30) Foreign Application Priority Data

Apr. 28, 2022     (KR) ........................ 10-2022-0052881

(51) Int. Cl.

| | |
|---|---|
| *C23C 28/00* | (2006.01) |
| *C23C 14/02* | (2006.01) |
| *C23C 14/18* | (2006.01) |
| *C23C 14/58* | (2006.01) |
| *C23C 16/24* | (2006.01) |
| *C23C 16/40* | (2006.01) |
| *C23C 16/56* | (2006.01) |
| *C23F 1/16* | (2006.01) |
| *G01N 21/3563* | (2014.01) |
| *G01N 21/35* | (2014.01) |

(52) U.S. Cl.
CPC .......... *C23C 28/322* (2013.01); *C23C 14/025* (2013.01); *C23C 14/185* (2013.01); *C23C 14/5873* (2013.01); *C23C 16/24* (2013.01);

*C23C 16/401* (2013.01); *C23C 16/56* (2013.01); *C23F 1/16* (2013.01); *G01N 21/3563* (2013.01); *G01N 2021/3595* (2013.01)

(58) Field of Classification Search
None
See application file for complete search history.

(56) References Cited

U.S. PATENT DOCUMENTS

| | | | |
|---|---|---|---|
| 5,386,121 | A | 1/1995 | Barbee et al. |
| 7,579,661 | B2 | 8/2009 | Miyata et al. |

(Continued)

FOREIGN PATENT DOCUMENTS

| | | |
|---|---|---|
| JP | 4463601 B2 | 2/2010 |
| KR | 100787281 B1 | 12/2007 |

(Continued)

OTHER PUBLICATIONS

Imamura, Kentaro , et al., "Reaction of Si nanopowder with water investigated by FT-IR and XPS", AIP Advances, vol. 7, Issue 8, Aug. 21, 2017, pp. 085310-1-085310-10.
Sun, X.H. , et al., "FTIR Spectroscopic Studies of the Stabilities and Reactivities of Hydrogen-Terminated Surfaces of Silicon Nanowires", Inorganic Chemistry, vol. 42, No. 3, Mar. 13, 2003, pp. 2398-2404.

*Primary Examiner* — Allan W. Olsen
(74) *Attorney, Agent, or Firm* — Wolf, Greenfield & Sacks, P.C.

(57)     ABSTRACT

A method of fabricating sample wafers includes forming silver particles on a surface of a wafer, forming nanowires on the wafer, removing the silver particles, and terminating dangling bond sites from surfaces of the nanowires with deuterium.

17 Claims, 13 Drawing Sheets

(56)                     References Cited

U.S. PATENT DOCUMENTS

| | | | | |
|---|---|---|---|---|
| 8,030,182 | B2 | 10/2011 | Ohmi et al. | |
| 8,361,852 | B2 | 1/2013 | Jeong | |
| 8,871,670 | B2 * | 10/2014 | Seebauer | B82Y 30/00 |
| | | | | 502/439 |
| 9,691,849 | B2 * | 6/2017 | Weisse | H01L 21/30604 |
| 2010/0221544 | A1 | 9/2010 | Baumer et al. | |
| 2011/0266521 | A1 * | 11/2011 | Ferrari | B82Y 30/00 |
| | | | | 257/14 |
| 2013/0012022 | A1 * | 1/2013 | Hung | H10F 77/703 |
| | | | | 977/762 |
| 2013/0175504 | A1 * | 7/2013 | Levy | G11C 16/10 |
| | | | | 257/29 |
| 2013/0307053 | A1 * | 11/2013 | Polishchuk | H10D 30/694 |
| | | | | 257/E29.262 |
| 2014/0225116 | A1 * | 8/2014 | Ramkumar | H10D 30/693 |
| | | | | 257/66 |
| 2017/0005108 | A1 * | 1/2017 | Byun | H01L 21/0217 |
| 2020/0111785 | A1 * | 4/2020 | Xiao | H10D 62/121 |

FOREIGN PATENT DOCUMENTS

| | | | |
|---|---|---|---|
| KR | 20080045260 | A | 5/2008 |
| KR | 101113628 | B1 | 2/2012 |
| KR | 101133444 | B1 | 4/2012 |
| KR | 102085612 | B1 | 3/2020 |

* cited by examiner

S100

START

CLEAN AND DRY WAFER — S110

FORM ADHESIVE LAYER, REFLECTIVE LAYER, SILICON OXIDE LAYER, AND SILICON LAYER ON WAFER, IN STATED ORDER — S120

FORM SAMPLE WAFER BY FORMING NANOWIRES IN SILICON LAYER — S130

TERMINATE SURFACES OF NANOWIRES WITH DEUTERIUM — S140

END wavenumber (cm$^{-1}$)

S200

START

CLEAN AND DRY WAFER — S210

FORM SILVER PARTICLES ON SURFACE OF WAFER — S220

FORM SAMPLE WAFER BY FORMING NANOWIRES IN WAFER — S230

REMOVE SILVER PARTICLES — S240

CLEAN AND DRY SAMPLE WAFER — S250

TERMINATE SURFACES OF NANOWIRES WITH DEUTERIUM — S260

END

200

METHODS OF FABRICATING SAMPLE WAFERS

CROSS-REFERENCE TO RELATED APPLICATION

This application is based on and claims priority under 35 U.S.C. § 119 to Korean Patent Application No. 10-2022-0052881, filed on Apr. 28, 2022, in the Korean Intellectual Property Office, the disclosure of which is incorporated by reference herein in its entirety.

BACKGROUND

The inventive concept relates generally to semiconductors and, more particularly to methods of manufacturing semiconductors.

During semiconductor fabrication processes, hydrogen may be bonded to dangling bond sites of semiconductors. However, hydrogen may be detached from dangling bond sites during high-temperature processes, and the dangling bond sites, from which hydrogen is detached, may become rearranged. Accordingly, lattice structures and electron density distributions of semiconductors may change, and issues, such as the deterioration of the performance of semiconductor devices, may occur. To solve such issues, a method of substituting bonded hydrogen with deuterium has been proposed. In general, to check whether bonded hydrogen is substituted with deuterium, Fourier-transform infrared spectroscopy (FT-IR) may be used. However, although FT-IR instruments may compare binding amounts between samples analyzed on the same day, it may be difficult for FT-IR instruments to compare binding amounts between samples analyzed on different days. As such, quantification processes using standard samples may be needed to compare binding amounts between samples analyzed on different days.

SUMMARY

The inventive concept provides methods of fabricating sample wafers that may be used to detect bonds between a wafer and deuterium through Fourier-transform infrared spectroscopy.

According to an aspect of the inventive concept, there is provided a method of fabricating a sample wafer, the method including forming silver particles on a surface of a semiconductor wafer, forming nanowires on the semiconductor wafer using the silver particles as a catalyst, removing the silver particles from the surface of the semiconductor wafer after the nanowires are formed, and terminating dangling bond sites from surfaces of the nanowires with deuterium.

According to another aspect of the inventive concept, there is provided a method of fabricating a sample wafer, the method including sequentially forming an adhesive layer, a reflective layer, a silicon oxide layer, and a silicon layer on a semiconductor wafer, forming nanowires on the silicon layer, and terminating dangling bond sites from surfaces of the nanowires with deuterium.

According to yet another aspect of the inventive concept, there is provided a method of fabricating a sample wafer, the method including forming silver particles on a surface of a silicon wafer by immersing the silicon wafer in a solution including hydrofluoric acid (HF) and silver nitrate (AgNO$_3$), wet etching the silicon wafer with a solution of hydrofluoric acid and hydrogen peroxide (H$_2$O$_2$) to form silicon nanowires on the silicon wafer, immersing the silicon wafer in a nitric acid (HNO$_3$) aqueous solution for a period of time and then removing the silver particles by sonicating the immersed silicon wafer, and terminating dangling bond sites from surfaces of the nanowires with deuterium by immersing the silicon wafer in a solution including heavy water (D$_2$O), wherein the silicon nanowires are formed at both an upper surface and a lower surface of the silicon wafer.

BRIEF DESCRIPTION OF THE DRAWINGS

Embodiments of the inventive concept will be more clearly understood from the following detailed description taken in conjunction with the accompanying drawings in which.

DETAILED DESCRIPTION OF THE EMBODIMENTS

Figure 1:
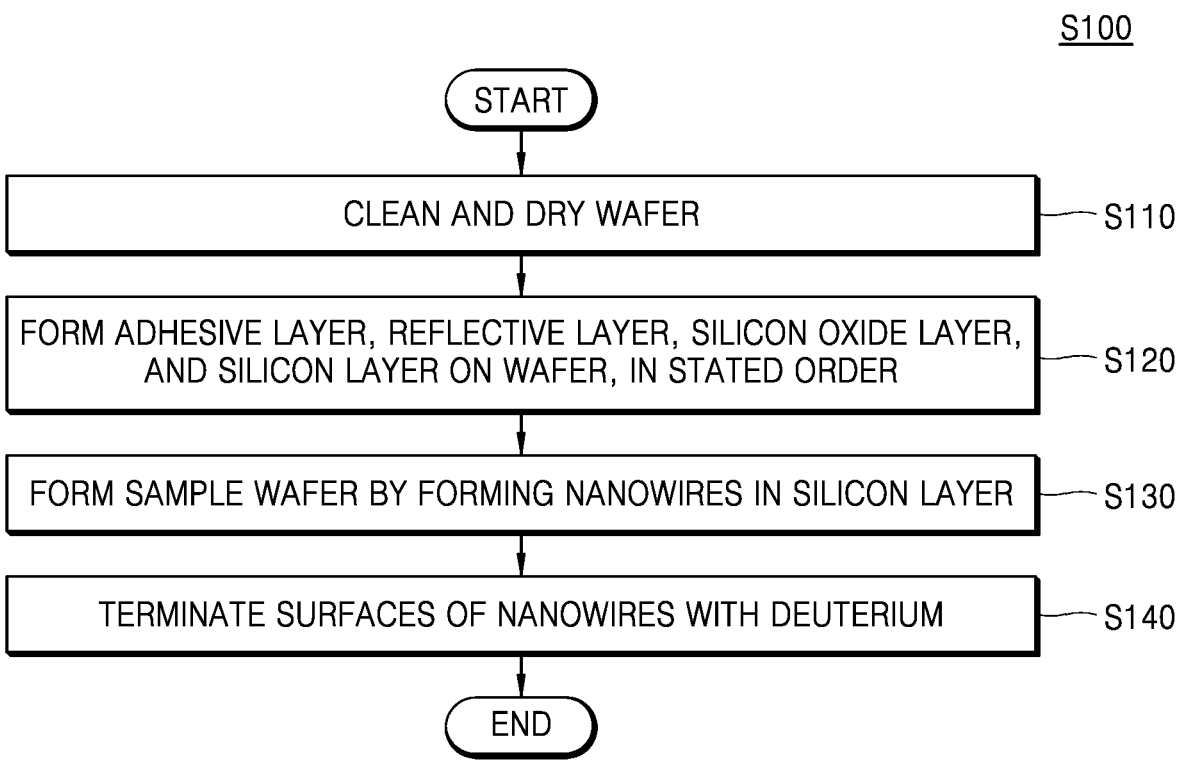
FIG. 1 is a flowchart illustrating a method of fabricating a sample wafer, according to an embodiment.

Hereinafter, embodiments of the inventive concept will be described in detail with reference to the accompanying drawings. Like components are denoted by like reference numerals throughout the specification, and repeated descriptions thereof are omitted.

Figure 2A:
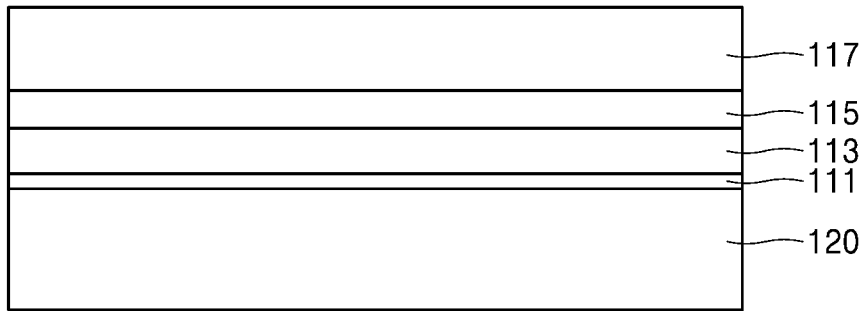
FIGS. 2A and 2B are cross-sectional views respectively illustrating operations of a method of fabricating a sample wafer, according to an embodiment.
Figure 2B:
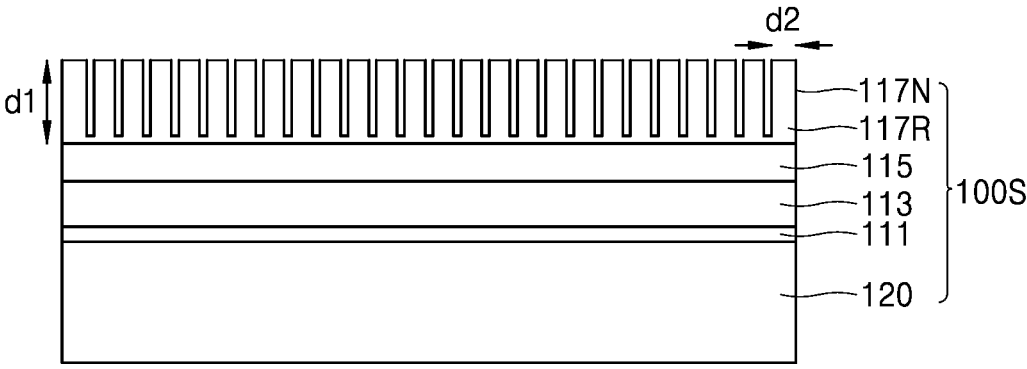

FIG. 1 is a flowchart illustrating a method S100 of fabricating a sample wafer, according to an embodiment. FIGS. 2A and 2B are cross-sectional views respectively illustrating operations of the method S100 of fabricating a sample wafer, according to an embodiment.

Referring to FIGS. 1 and 2A, a wafer 120 may be cleaned and then dried (S110). In an embodiment, the wafer 120 may include a silicon (Si) wafer. However, the inventive concept is not limited thereto, and the wafer 120 may include, for example, a germanium (Ge) wafer. In an embodiment, the wafer 120 may be cleaned, for example, with acetone, isopropyl alcohol, and triple distilled water for about 3 minutes. In an embodiment, the cleaned wafer 120 may be dried at about 58° C. for about 30 minutes.

Referring to FIGS. 1 and 2A, an adhesive layer 111, a reflective layer 113, a silicon oxide layer 115, and a silicon layer 117 may be formed, in the stated (i.e., sequential) order, on the wafer 120 having undergone operation S110 (S120).

The adhesive layer 111 may be arranged between the wafer 120 and the reflective layer 113. The adhesive layer 111 may couple the wafer 120 and the reflective layer 113 to each other. In an embodiment, the adhesive layer 111 may include, but is not limited to, titanium (Ti). In an embodiment, the adhesive layer 111 may have, but is not limited to, a thickness of about 10 nm.

The reflective layer 113 may be formed on the adhesive layer 111. The reflective layer 113 may reflect light when performing reflection type Fourier-transform infrared spectroscopy (FT-IR) measurement. In an embodiment, the reflective layer 113 may include, but is not limited to, gold (Au), and may include another material capable of reflecting light when performing the reflection type FT-IR measurement. In an embodiment, the reflective layer 113 may have, but is not limited to, a thickness of about 200 nm.

In an embodiment, the adhesive layer 111 and the reflective layer 113 may be formed in the stated order by sputtering, but the inventive concept is not limited thereto.

A silicon oxide layer 115 may be arranged between the reflective layer 113 and the silicon layer 117. The silicon oxide layer 115 may be coupled to the silicon layer 117 to cause the silicon layer 117 not to be peeled off and may prevent a spark that may be generated due to microwave irradiation in operation S140 described below. In an embodiment, the silicon oxide layer 115 may have, but is not limited to, a thickness of about 200 nm.

The silicon layer 117 may be formed on the silicon oxide layer 115. In operation S130 described below, nanowires 117N (FIG. 2B) may be formed in the silicon layer 117. In an embodiment, the silicon layer 117 may include at least one selected from amorphous silicon and polycrystalline silicon. For example, the silicon layer 117 may include only amorphous silicon. In an embodiment, the silicon layer 117 may have a thickness of about 500 nm to about 2000 nm. For example, the silicon layer 117 may have a thickness of about 500 nm.

In an embodiment, the silicon oxide layer 115 and the silicon layer 117 may be deposited by chemical vapor deposition (CVD), but the inventive concept is not limited thereto.

Referring to FIGS. 1 and 2B, the nanowires 117N may be formed in the silicon layer 117 (S130). A portion of the silicon layer 117, in which the nanowires 117N are not formed, may be a residual silicon layer 117R. The nanowires 117N may respectively have, but are not limited to, cylindrical shapes. In an embodiment, each of the nanowires 117N may have a thickness d1 (FIG. 2B) of about 400 nm to about 2000 nm. Because the nanowires 117N are formed in the silicon layer 117, the thickness d1 of each of the nanowires 117N may vary depending on a material constituting the silicon layer 117. For example, when the silicon layer 117 includes amorphous silicon, the thickness d1 of each of the nanowires 117N may be about 500 nm, and when the silicon layer 117 includes amorphous silicon and polycrystalline silicon arranged on amorphous silicon, the thickness d1 of each of the nanowires 117N may be about 420 nm.

In an embodiment, each of the nanowires 117N may have a diameter d2 (FIG. 2B) of about 20 nm to about 200 nm. For example, the diameter d2 of each of the nanowires 117N may be about 200 nm.

In operation S130, dangling bond sites may be formed at surfaces of the nanowires 117N. The dangling bond sites may be terminated with hydrogen or deuterium, as described below.

In an embodiment, operation S130 may include a first operation of performing a lithography process on the silicon layer 117 and a second operation of performing, on the silicon layer 117, a wet etching process using a mixed solution including hydrofluoric acid and hydrogen peroxide (H$_2$O$_2$). By immersing the wafer 120, over which the silicon layer 117 is formed, in the mixed solution including hydrofluoric acid and hydrogen peroxide, at least some of the dangling bond sites of the nanowires 117N, which are formed in the silicon layer 117 by performing the lithography process, may be terminated with hydrogen.

In another embodiment, operation S130 may include a first operation of performing a lithography process on the silicon layer 117 and a second operation of immersing the wafer 120, over which the silicon layer 117 is formed, in a mixed solution including hydrogen peroxide and heavy water (D$_2$O). By immersing the wafer 120, over which the silicon layer 117 is formed, in the mixed solution including hydrogen peroxide and heavy water, at least some of the dangling bond sites of the nanowires 117N, which are formed in the silicon layer 117 by performing the lithography process, may be terminated with deuterium.

In an embodiment, the first operation may include performing an electron beam lithography process. However, the inventive concept is not limited thereto, and the first operation may include, for example, performing a lithography process using extreme ultraviolet (EUV) light.

In an embodiment, the mixed solution may include a mixed solution in which 150 mL of a hydrofluoric acid aqueous solution having a concentration of 10% by volume (vol %) is mixed with 150 mL of a hydrogen peroxide aqueous solution having a concentration of 1.5 vol %. The wet etching process may be performed by immersing the wafer 120 in the mixed solution at about 37° C. for about 2 hours.

After operation S130 is performed, surfaces of the nanowires 117N of a sample wafer 100S may be terminated with deuterium (S140). In an embodiment, operation S140 may be performed by immersing the sample wafer 100S in a solution including heavy water and irradiating the sample wafer 100S with microwave radiation. By performing operation S140, dangling bond sites formed at the surfaces of the nanowires 117N may be terminated with deuterium, and hydrogen binding sites formed at the surfaces of the nanowires 117N may be substituted with deuterium. In an embodiment, the microwave radiation may have a frequency of about 1 GHz to about 10 GHz. For example, the frequency of the microwave radiation may be about 2.45 GHz. In an embodiment, the microwave radiation may have power of about 700 W to about 2000 W. In an embodiment, the microwave radiation may be irradiated for a certain period of time and may not be irradiated for another period of time, in an alternate manner. For example, the irradiation of the sample wafer 100S with the microwave radiation, alternately, may be performed for about 15 seconds and may not be performed for about 45 seconds, and this cycle may be repeated about 10 times.

The sample wafer 100S fabricated by the method S100 of fabricating a sample wafer may be stored in heavy water to prevent the nanowires 117N of the sample wafer 100S from being oxidized.

The sample wafer 100S fabricated by the method S100 of fabricating a sample wafer may be used as a standard sample for the reflection type FT-IR measurement for detecting deuterium bonds. In addition, the sample wafer 100S fabricated according to an embodiment may detect silicon-deuterium bonds well even when having a relatively low thickness. Therefore, the sample wafer 100S according to an embodiment may be used to detect a minute amount of silicon-deuterium bonds through an FT-IR analysis technique. In addition, as described below with reference to FIG. 3, because some of the dangling bond sites of the sample wafer 100S may be terminated with hydrogen, the sample wafer 100S may also be used to detect silicon-hydrogen bonds.

Figure 3:
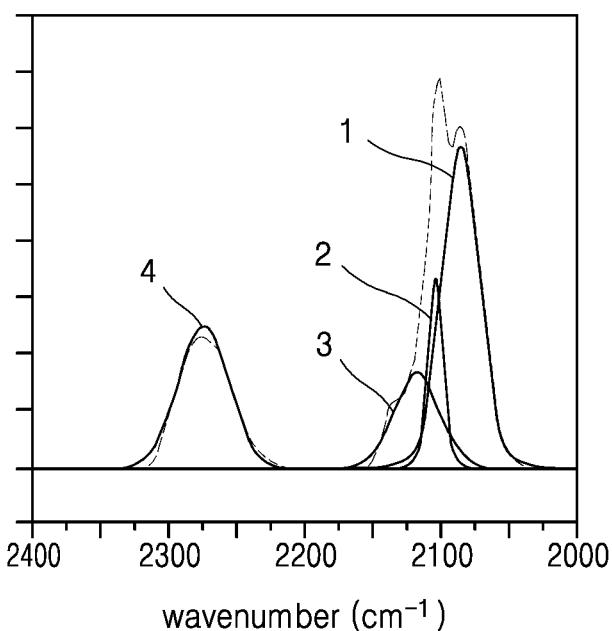
FIG. 3 is a graph illustrating a result obtained by detecting peaks of silicon-hydrogen bonds of a sample wafer according to an embodiment through reflection type Fourier-transform infrared spectroscopy (FT-IR) measurement.

FIG. 3 is a graph illustrating a result obtained by detecting peaks of silicon-hydrogen bonds of a sample wafer according to an embodiment through the reflection type FT-IR measurement. In the graph of FIG. 3, the peaks marked by 1, 2, 3, and 4 respectively denote Si—H, Si—H$_2$, Si—H$_3$, and HSi—O$_x$—SiH, the X-axis denotes wavenumbers, and the Y-axis denotes degrees of absorption of energy corresponding to vibrations and rotations of molecules due to the irradiation of infrared rays.

Referring to FIG. 3, when the sample wafer 100S fabricated by the method 5100 was analyzed, the peak of the Si—H bond having a wavenumber of 2083 cm$^{-1}$, the peak of the Si—H$_2$ bond having a wavenumber of 2102 cm$^{-1}$, the peak of the Si—H$_3$ bond having a wavenumber of 2116 cm$^{-1}$, and the peak of the HSi—O$_x$—SiH bond having a wavenumber of 2274 cm$^{-1}$ were detected. From these results, it could be confirmed that, by detecting the peaks of the respective silicon-hydrogen bonds through the reflection type FT-IR measurement, the dangling bond sites formed at the surfaces of the nanowires 117N of the sample wafer 100S may be identified. In an embodiment, the respective silicon-hydrogen bonding sites may be quantified by detecting a peak of carbon dioxide (CO$_2$) through the reflection type FT-IR measurement and then using the area of the detected peak of carbon dioxide. For example, it can be confirmed that, when the area of the peak of 409 ppm of carbon dioxide detected through the reflection type FT-IR measurement is 0.6, and a sum of the area of the peak of Si—H, the area of the peak of Si—H$_2$, and the area of the peak of Si—H$_3$ is 0.1, the amount of the bonding sites of Si—H, Si—H$_2$, and Si—H$_3$ are about ⅙ of that of carbon dioxide.

Figure 4:
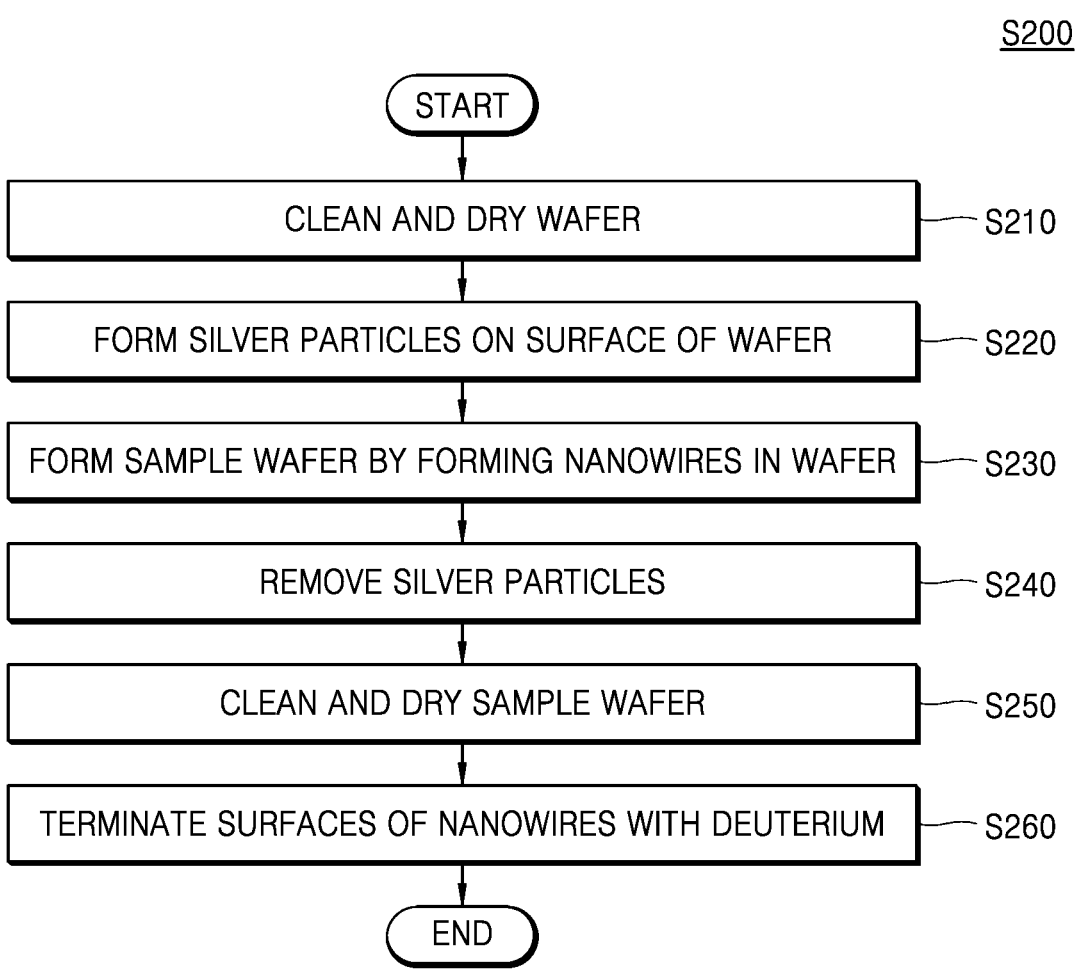
FIG. 4 is a flowchart illustrating a method of fabricating a sample wafer, according to an embodiment.

FIG. 4 is a flowchart illustrating a method S200 of fabricating a sample wafer, according to an embodiment. FIGS. 5A to 5D are cross-sectional views respectively illustrating operations of the method S200 of fabricating a sample wafer, according to an embodiment. Although the method S200 of fabricating a sample wafer is described below with reference to a silicon (Si) wafer, other wafer materials may be utilized and embodiments of the present inventive concept are not limited to silicon.

Figure 5A:
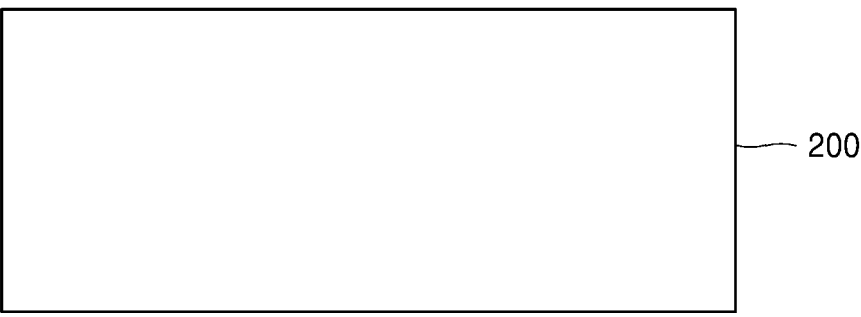
FIGS. 5A to 5D are cross-sectional views respectively illustrating operations of a method of fabricating a sample wafer, according to an embodiment.

Referring to FIGS. 4 and 5A, the wafer 200 may be cleaned and then dried. In an embodiment, the wafer 200 may be cleaned with acetone, isopropyl alcohol, and triple distilled water for about 3 minutes. Triple distilled water refers to ultrapure water obtained through three distillation processes and having a resistivity of 18 MΩ·cm or more. In an embodiment, the cleaned wafer 200 may be dried at about 58° C. for about 30 minutes. In an embodiment, the wafer 200 may include, but is not limited to, single-crystal silicon.

Figure 5B:
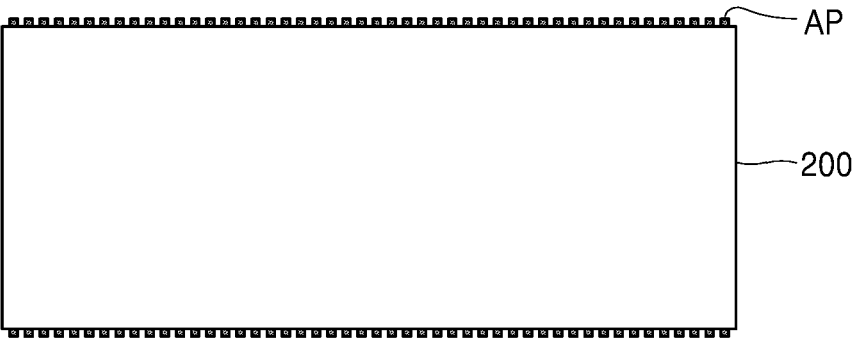

Referring to FIGS. 4 and 5B, silver particles AP may be formed on a surface of the wafer 200 having undergone operation S210 (S220). In an embodiment, the wafer 200 having undergone operation S210 may be immersed in a mixed solution including hydrofluoric acid (HF) and silver nitrate (AgNO$_3$), thereby forming the silver particles AP on both surfaces of the wafer 200. In an embodiment, the mixed solution may include a mixed solution in which 200 mL of a hydrofluoric acid aqueous solution having a concentration of 10 vol % is mixed with 200 mL of a silver nitrate aqueous solution having a concentration of 20 mM. In an embodiment, the wafer 200 having undergone operation S210 may be immersed in the mixed solution for a period of time selected from a range of about 2 minutes to about 5 minutes. For example, the wafer 200 having undergone operation S210 may be immersed in the mixed solution for about 3 minutes.

In an embodiment, after operation S220 is performed, before operation S230 is performed, the wafer 200 having undergone operation S220 may be cleaned with triple distilled water for a certain period of time. For example, the wafer 200 having undergone operation S220 may be cleaned with triple distilled water for about 1 minute.

Figure 5C:
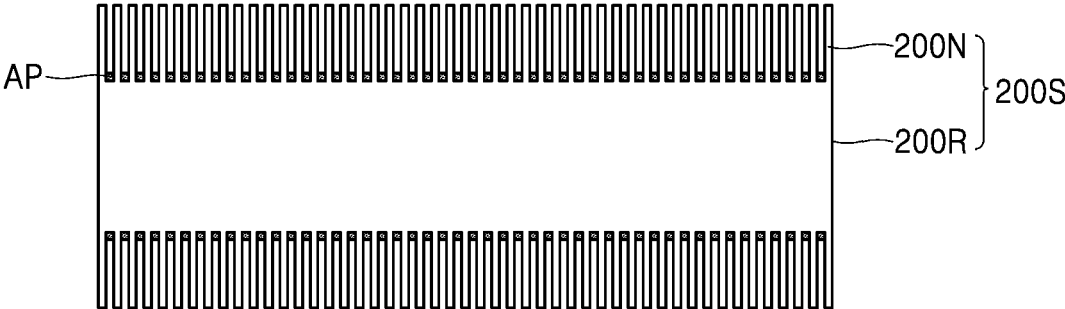

Referring to FIGS. 4 and 5C, nanowires 200N may be formed in a portion of the wafer 200 (see FIG. 5B) having undergone operation S220 (S230). In this case, a portion of the wafer 200, in which the nanowires 200N are not formed, may be a residual wafer 200R. Accordingly, a sample wafer 200S including the nanowires 200N and the residual wafer 200R may be formed. In an embodiment, the wafer 200 having undergone operation S220 may be immersed in a mixed solution including hydrofluoric acid and hydrogen peroxide (H$_2$O$_2$) and thus be wet-etched, thereby forming the nanowires 200N. In an embodiment, the mixed solution may include a mixed solution in which 150 mL of a hydrofluoric acid aqueous solution having a concentration of 10 vol % is mixed with 150 mL of a hydrogen peroxide aqueous solution having a concentration of 1.5 vol %. In an embodiment, the wafer 200 having undergone operation S220 may be immersed in the mixed solution at a temperature selected from a range of about 32° C. to about 40° C. For example, the wafer 200 having undergone operation S220 may be immersed in the mixed solution at about 37° C. In an embodiment, the wafer 200 having undergone operation S220 may be immersed in the mixed solution for a period of time selected from a range of about 1 hour to about 3 hours. For example, the wafer 200 having undergone operation S220 may be immersed in the mixed solution for about 2 hours.

In operation S230, the silver particles AP formed on both surfaces of the wafer 200 may function as a catalyst. Hereinafter, wet etching, in which the silver particles AP function as a catalyst, is described in detail with reference to Chemical Equations 1 to 3.

In general, a chemical reaction between a silicon wafer and a mixed solution including hydrofluoric acid and hydrogen peroxide may be represented by Chemical Equations 1 and 2.

$$Si + 2H_2O \rightarrow SiO_2 + 4H^+ + 4e^- \qquad \text{[Chemical Equation 1]}$$

$$SiO_2 + 6HF \longrightarrow SiF_6^{2-} + 2H_3O^+$$

As in Chemical Equation 1, silicon dioxide (SiO$_2$) is formed by a chemical reaction between silicon and water. Silicon dioxide is bonded to hydrofluoric acid as in Chemical Equation 2, thereby etching the silicon wafer.

In the etching reaction described above, when silver particles are formed on a surface of the silicon wafer, the silver particles function as a catalyst that activates the oxidation-reduction of hydrogen peroxide and thus causes an etching reaction in which hydrogen peroxide oxidizes a silicon layer contacting the silver particles into silica. Accordingly, as in Chemical Equation 3 below, hydrogen peroxide is bonded to hydrogen and electrons to become water, and etching into the inside of the silicon wafer, on which the silver particles are formed, is performed.

$$H_2O_2 + 2H^+ + 2e^- \rightarrow 2H_2O \qquad \text{[Chemical Equation 3]}$$

Therefore, the nanowires 200N may be formed, as shown in FIG. 5C. By using the silver particles AP as a catalyst, the nanowires 200N each having a greater diameter d4 (FIG. 5D) and a higher thickness d3 (FIG. 5D) may be formed.

In an embodiment, the nanowires 200N may be formed at both surfaces of the wafer 200. Accordingly, more dangling bond sites may be provided, as compared with the case where the nanowires 200N are formed at only one surface of the wafer 200. Each of the nanowires 200N may have, but is not limited to, a cylindrical shape.

In an embodiment, the nanowires 200N may respectively have a plurality of regularly arranged nanoparticles. For example, the nanowires 200N may respectively include regularly arranged silicon nanowires. Accordingly, in operation S260 described below, unpaired electrons of the nanowires 200N exposed in the same direction as a microwave electric field vector may be more prone to be in an excited state due to microwave radiation.

In an embodiment, the thickness d3 of each of the nanowires 200N may be about 10 µm to about 45 µm. In an embodiment, the thickness d3 of each of the nanowires 200N may be about 20 µm to about 38 µm. For example, the thickness d3 of each of the nanowires 200N may be about 30 µm. However, the inventive concept is not limited thereto, and the thickness d3 of each of the nanowires 200N may vary by adjusting the period of time of immersing the wafer 200.

In an embodiment, the diameter d4 of each of the nanowires 200N may be about 400 nm to about 600 nm. However, the inventive concept is not limited thereto, and the diameter d4 of each of the nanowires 200N may vary by adjusting the concentration of the mixed solution.

Because the thicknesses d3 and the diameters d4 of the nanowires 200N are respectively greater than thicknesses and diameters of nanowires of conventional wafers, the nanowires 200N may be used as a standard sample capable of undergoing more processes than the nanowires of conventional wafers.

Silicon dangling bond sites may be formed at the surfaces of the nanowires 200N that are formed by performing operation S230. In this case, during the process of performing operation S230, some of the dangling bond sites may be terminated with hydrogen included in the mixed solution.

In an embodiment, after operation S230 is performed, before operation S240 is performed, the sample wafer 200S may be cleaned with triple distilled water for a certain period of time. For example, the sample wafer 200S having undergone operation S230 may be cleaned with triple distilled water for about 1 minute.

Figure 5D:
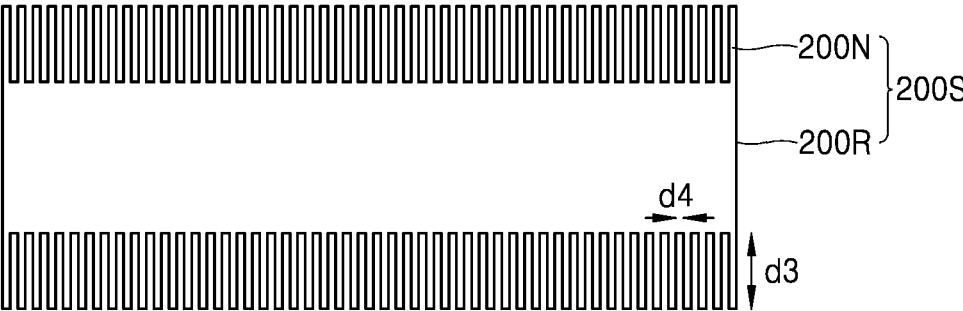

Referring to FIGS. 4 and 5D, after operation S230 is performed, the silver particles AP remaining between the residual wafer 200R and the nanowires 200N may be removed (S240). In an embodiment, by immersing the sample wafer 200S having undergone operation S230 in a nitric acid aqueous solution, the silver particles AP remaining on the sample wafer 200S may be removed. In an embodiment, the nitric acid aqueous solution may have a concentration of about 1.875 M and a volume of about 240 mL. In an embodiment, the sample wafer 200S may be immersed in the nitric acid aqueous solution at a temperature selected from a range of about 32° C. to about 40° C. For example, the sample wafer 200S may be immersed in the nitric acid aqueous solution at about 37° C. In an embodiment, the sample wafer 200S may be immersed in the nitric acid aqueous solution for a period of time selected from a range of about 1 hour 30 minutes to about 2 hours 30 minutes. For example, the sample wafer 200S may be immersed in the nitric acid aqueous solution for about 2 hours.

In an embodiment, operation S240 may further include sonicating the sample wafer 200S, after immersing the sample wafer 200S in the nitric acid aqueous solution. In an embodiment, the nitric acid aqueous solution may have a concentration of about 1.875 M and a volume of about 240 mL. In an embodiment, the sonication of the sample wafer 200S may be performed for about 30 minutes, but the inventive concept is not limited thereto. When the sonication of the sample wafer 200S is performed, the silver particles AP remaining on the sample wafer 200S may be removed better (i.e., the silver particles AP may be removed substantially entirely). Accordingly, in operation S260 described below, the inhibition of a silicon-deuterium substitution reaction due to a spark generated by the unremoved silver particles AP may be improved.

After operation S240 is performed, the sample wafer 200S may be cleaned and then dried. In an embodiment, the sample wafer 200S may be cleaned with triple distilled water. In an embodiment, the sample wafer 200S may be cleaned for about 3 minutes, but the inventive concept is not limited thereto. In an embodiment, the cleaned sample wafer 200S may be dried at about 58° C. In an embodiment, the drying of the sample wafer 200S may be performed for about a day, but the inventive concept is not limited thereto.

After operation S250 is performed, the surfaces of the nanowires 200N of the sample wafer 200S may be terminated with deuterium (S260). At the surfaces of the nanowires 200N formed by performing operation S230, silicon dangling bond sites due to the etching process, or binding sites terminated with hydrogen during operation S230 may be formed. In an embodiment, operation S260 may be performed by immersing the sample wafer 200S in a solution including heavy water ($D_2O$).

In an embodiment, the solution including heavy water may include fluoric acid, nitric acid, sulfuric acid ($H_2SO_4$), heavy water, and light water ($H_2O$). In an embodiment, a ratio of deuterium atoms in the solution including heavy water to hydrogen atoms in the solution including heavy water may be 1. For example, the solution including heavy water may include a mixed solution of about 21.93 mL of a hydrofluoric acid aqueous solution having a concentration of about 48 vol %, about 6.05 mL of a nitric acid aqueous solution having a concentration of about 70 vol %, about 21.44 mL of a sulfuric acid aqueous solution having a concentration of about 99.999 vol %, about 10.68 mL of $H_2O$, and about 39.9 mL of $D_2O$. In an embodiment, the sample wafer 200S may be immersed in the solution including heavy water for about 2 seconds, but the inventive concept is not limited thereto.

In an embodiment, the sample wafer 200S immersed in the solution including heavy water may be additionally cleaned and dried. For example, the sample wafer 200S immersed in the solution including heavy water may be cleaned with heavy water and then be dried at about 58° C. for about 30 minutes.

In an embodiment, operation S260 may be performed by immersing the sample wafer 200S in the solution including heavy water and irradiating the sample wafer 200S with microwave radiation. In this case, the solution including heavy water may include only heavy water and may not include any other solutions. In an embodiment, the microwave radiation may have a frequency of about 1 GHz to about 10 GHz. For example, the frequency of the microwave radiation may be about 2.45 GHz. In an embodiment, the microwave radiation may have power of about 700 W to about 2000 W. In an embodiment, the microwave radiation may be irradiated for a certain period of time and may not be irradiated for another period of time, in an alternate manner. For example, the irradiation of the sample wafer 200S with the microwave radiation, alternately, may be performed for about 15 seconds and may not be performed for about 45 seconds, and this cycle may be repeated about 10 times.

The sample wafer 200S fabricated by the method S200 of fabricating a sample wafer may be stored in heavy water to prevent the nanowires 200N of the sample wafer 200S from being oxidized.

The sample wafer 200S fabricated according to an embodiment may be used as a standard sample for the transmission type FT-IR measurement. In particular, because the nanowires 200N included in the sample wafer 200S may include Si—D bonds that are regularly arranged, vibrations of the Si—D bonds may be made in a particular direction along with the irradiation of infrared rays.

Figure 6A:
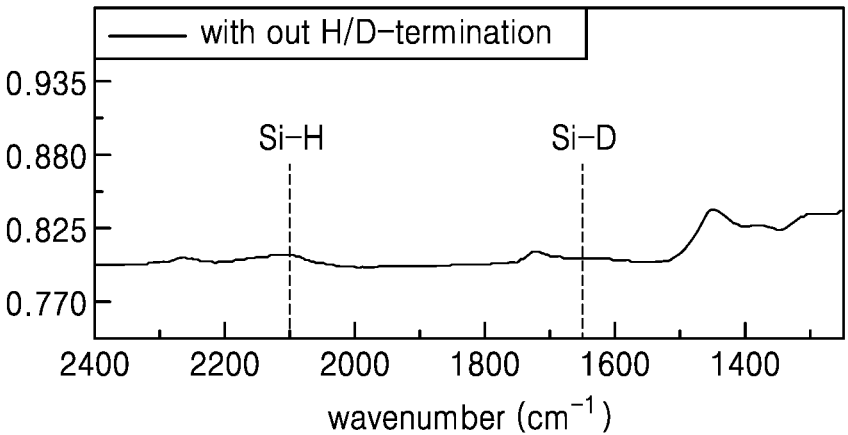
FIGS. 6A and 6B are graphs respectively illustrating results obtained by detecting peaks of silicon-deuterium bonds of a silicon wafer according to an embodiment through transmission type FT-IR measurement.
Figure 6B:
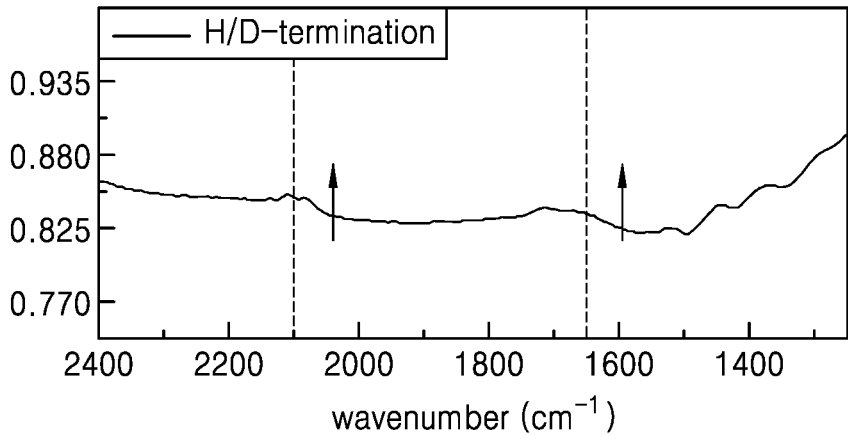

FIGS. 6A and 6B are graphs respectively illustrating results obtained by detecting peaks of silicon-deuterium bonds of the sample wafer 200S according to an embodiment through the transmission type FT-IR measurement. FIG. 6A is a graph illustrating a detection result before operation S260 is performed, and FIG. 6B is a graph illustrating a detection result after operation S260 is performed. The sample wafer 200S used in the detection of FIG. 6B is the sample wafer 200S fabricated by performing operation S260 using the mixed solution described above and including hydrofluoric acid, nitric acid, sulfuric acid, and heavy water. In FIGS. 6A and 6B, the X-axis denotes wavenumbers, and the Y-axis denotes degrees of absorption of energy corresponding to vibrations and rotations of molecules due to the irradiation of infrared rays.

Referring to FIG. 6A, when the sample wafer 200S before operation S260 was performed was analyzed, peaks of silicon-hydrogen bonds and peaks of silicon-deuterium bonds were not detected. On the other hand, referring to FIG. 6B, when the sample wafer 200S, which is fabricated by performing operation S260 using the mixed solution including hydrofluoric acid, nitric acid, sulfuric acid, and heavy water, was analyzed, a peak of a silicon-hydrogen bond having a wavenumber of 2093 cm$^{-1}$ and a peak of a silicon-deuterium bond having a wavenumber of 1639 cm$^{-1}$ were detected. That is, it could be confirmed that the silicon-hydrogen bond and the silicon-deuterium bond are formed through operation S260. According to these results, the sample wafer 200S fabricated according to an embodiment may be used as a standard sample for comparing changes in the amount of the silicon-deuterium bond along with performing various processes.

Figure 7A:
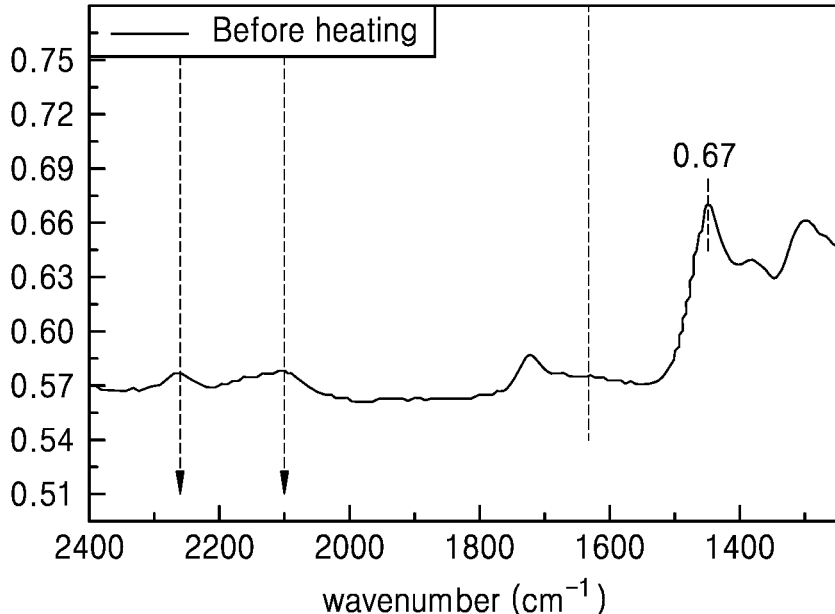
FIGS. 7A and 7B are graphs respectively illustrating results obtained by detecting peaks of silicon-deuterium bonds of a silicon wafer according to an embodiment through transmission type FT-IR measurement.
Figure 7B:
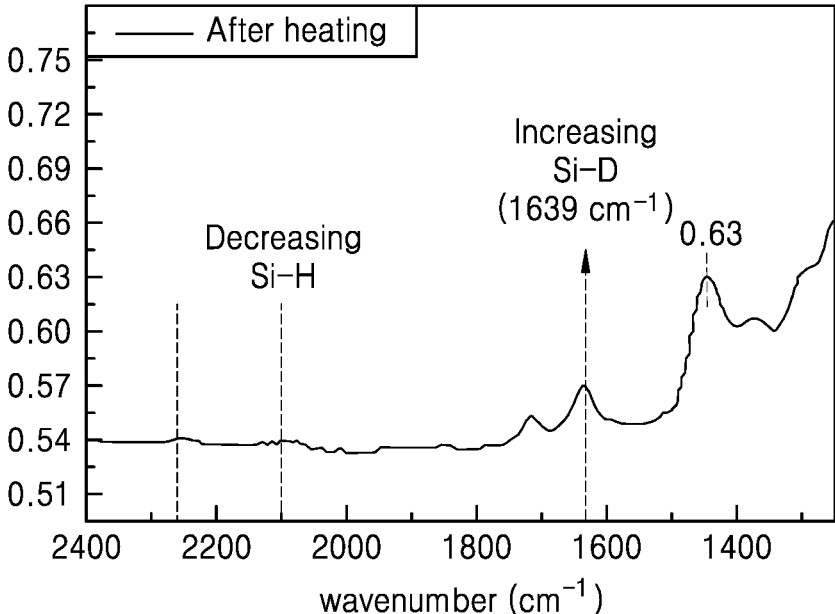

FIGS. 7A and 7B are graphs respectively illustrating results obtained by detecting peaks of silicon-deuterium bonds of the silicon wafer 200S according to an embodiment through the transmission type FT-IR measurement. FIG. 7A is a graph illustrating a detection result before operation S260 is performed, and FIG. 7B is a graph illustrating a detection result after operation S260 is performed. The sample wafer 200S used in the detection of FIG. 7B is the sample wafer 200S fabricated by performing operation S260, in which the sample wafer 200S is immersed in a solution including heavy water and irradiated with microwave radiation. In FIGS. 7A and 7B, the X-axis denotes wavenumbers, and the Y-axis denotes degrees of absorption of energy corresponding to vibrations and rotations of molecules due to the irradiation of infrared radiation.

Referring to FIG. 7A, when the sample wafer 200S before operation S260 is performed was analyzed, a peak of a silicon-hydrogen bond was detected, but a peak of a silicon-deuterium bond was not detected. On the other hand, referring to FIG. 7B, when the sample wafer 200S, which is fabricated by immersing the sample wafer 200S in the solution including heavy water and irradiating the sample wafer 200S with the microwave radiation, was analyzed, the peak of the silicon-hydrogen bond having a wavenumber of 2093 cm$^{-1}$ decreased, and the peak of the silicon-deuterium bond having a wavenumber of 1639 cm$^{-1}$ was detected. That is, it could be confirmed that the silicon-deuterium bond is formed through operation S260. According to these results, the sample wafer 200S fabricated according to an embodiment may be used as a standard sample for comparing changes in the amount of the silicon-deuterium bond along with performing various processes.

While the inventive concept has been particularly shown and described with reference to embodiments thereof, it will be understood that various changes in form and details may be made therein without departing from the scope of the following claims.

What is claimed is:

1. A method of fabricating a sample wafer, the method comprising:

forming silver particles on a surface of a semiconductor wafer;

forming nanowires on the semiconductor wafer using the silver particles as a catalyst;

removing the silver particles from the surface of the semiconductor wafer after the nanowires are formed; and terminating dangling bond sites from surfaces of the nanowires with deuterium, wherein the terminating dangling bond sites from surfaces of the nanowires with deuterium comprises immersing the semiconductor wafer in a solution comprising heavy water, and then irradiating the immersed semiconductor wafer with microwave radiation.

2. The method of claim 1, wherein the forming silver particles on the surface of the semiconductor wafer comprises immersing the semiconductor wafer in a solution comprising hydrofluoric acid (HF) and silver nitrate (AgNO$_3$).

3. The method of claim 1, wherein the forming nanowires on the semiconductor wafer comprises wet etching the semiconductor wafer using a solution of hydrofluoric acid and hydrogen peroxide (H$_2$O$_2$).

4. The method of claim 1, wherein the nanowires are formed at both an upper surface and a lower surface of the semiconductor wafer.

5. The method of claim 1, wherein each of the nanowires has a thickness of at least about 30 μm and a diameter of about 400 nm to about 600 nm.

6. The method of claim 1, wherein the removing the silver particles from the semiconductor wafer comprises immersing the semiconductor wafer in a nitric acid (HNO$_3$) aqueous solution.

7. The method of claim 1, wherein the removing the silver particles from the surface of the semiconductor wafer comprises immersing the semiconductor wafer in a nitric acid (HNO$_3$) aqueous solution and then sonicating the immersed semiconductor wafer.

8. A method of fabricating a sample wafer, the method comprising:

sequentially forming an adhesive layer, a reflective layer, a silicon oxide layer, and then a silicon layer on a semiconductor wafer;

forming nanowires on the silicon layer; and terminating dangling bond sites from surfaces of the nanowires with deuterium.

9. The method of claim 8, wherein the adhesive layer comprises titanium (Ti).

10. The method of claim 8, wherein the reflective layer comprises gold (Au).

11. The method of claim 8, wherein each of the nanowires has a thickness of at least about 400 nm and a diameter of at least about 200 nm.

12. The method of claim 8, wherein the forming nanowires on the silicon layer comprises performing an electron beam lithography process on the silicon layer and wet etching the silicon layer using a solution comprising hydrofluoric acid and hydrogen peroxide ($H_2O_2$).

13. The method of claim 8, wherein the terminating dangling bond sites from surfaces of the nanowires with deuterium comprises immersing the semiconductor wafer in a solution comprising heavy water ($D_2O$), and irradiating the silicon layer of the immersed semiconductor wafer with microwave radiation.

14. The method of claim 8, wherein the silicon layer comprises at least one of amorphous silicon and polycrystalline silicon.

15. A method of fabricating a sample wafer, the method comprising:

forming silver particles on a surface of a silicon wafer by immersing the silicon wafer in a solution comprising hydrofluoric acid (HF) and silver nitrate ($AgNO_3$);

wet etching the silicon wafer with a solution comprising hydrofluoric acid and hydrogen peroxide ($H_2O_2$) to form silicon nanowires on the silicon wafer;

immersing the silicon wafer in a nitric acid ($HNO_3$) aqueous solution for a period of time and then removing the silver particles by sonicating the immersed silicon wafer; and terminating dangling bond sites from surfaces of the nanowires with deuterium by immersing the silicon wafer in a solution comprising heavy water ($D_2O$), wherein the silicon nanowires are formed at both an upper surface and a lower surface of the silicon wafer.

16. The method of claim 15, wherein the solution comprising heavy water further comprises hydrofluoric acid, nitric acid, sulfuric acid ($H_2SO_4$), and light water ($H_2O$), and a ratio of deuterium atoms to hydrogen atoms in the solution comprising heavy water is 1.

17. The method of claim 15, wherein the terminating dangling bond sites from surfaces of the nanowires comprises irradiating the immersed silicon wafer with microwave radiation.

\* \* \* \* \*